(12) United States Patent
Lin et al.

(10) Patent No.: US 8,742,261 B2
(45) Date of Patent: Jun. 3, 2014

(54) TRANSPARENT CONDUCTIVE FILM AND TOUCH PANEL USING THE SAME

(75) Inventors: Ming-Tien Lin, New Taipei (TW); Po-Sheng Shih, New Taipei (TW)

(73) Assignee: Shih Hua Technology Ltd., Zhubei, Hsinchu County (TW)

( * ) Notice: Subject to any disclaimer, the term of this patent is extended or adjusted under 35 U.S.C. 154(b) by 223 days.

(21) Appl. No.: 13/340,084

(22) Filed: Dec. 29, 2011

(65) Prior Publication Data

US 2013/0048354 A1 Feb. 28, 2013

(30) Foreign Application Priority Data

Aug. 31, 2011 (TW) .............................. 100131255 A

(51) Int. Cl.
- *H05K 1/09* (2006.01)
- *H05K 1/11* (2006.01)
- *B82Y 99/00* (2011.01)

(52) U.S. Cl.
USPC ........................... 174/257; 174/261; 977/932

(58) Field of Classification Search
USPC .................. 174/257, 261; 977/932
See application file for complete search history.

(56) References Cited

U.S. PATENT DOCUMENTS

2008/0166551 A1 7/2008 Sasa et al.

*Primary Examiner* — Timothy Thompson
*Assistant Examiner* — Charles Pizzuto
(74) *Attorney, Agent, or Firm* — Novak Druce Connolly Bove + Quigg LLP

(57) ABSTRACT

A transparent conductive film includes a number of first transparent conductive stripes extending along a first direction and a number of second transparent conductive stripes extending along a second direction and intersecting the number of first transparent conductive stripes. The first conductive stripes are spaced from each other and extend substantially along a first direction. The second transparent conductive stripes are spaced from each other and extend substantially along a second direction. The first transparent conductive stripes are electrically connected with the second transparent conductive stripes. The first transparent conductive stripes and the second conductive stripes are arranged in patterns such that the transparent conductive film has an anisotropic impedance. The first direction is a low impedance direction. A resistivity of the transparent conductive film in the low impedance direction is smaller than the resistivity of the transparent conductive film in the second direction and any other direction.

18 Claims, 9 Drawing Sheets

TRANSPARENT CONDUCTIVE FILM AND TOUCH PANEL USING THE SAME

This application claims all benefits accruing under 35 U.S.C. §119 from Taiwan Patent Application No. 100131255, filed on Aug. 31, 2011, in the Taiwan Intellectual Property Office, the contents of which are hereby incorporated by reference. This application is related to commonly-assigned applications entitled, "TRANSPARENT CONDUCTIVE FILM AND TOUCH PANEL USING THE SAME," filed on Sep. 29, 2011, and application Ser. No. 13/340,069; and "TRANSPARENT CONDUCTIVE FILM AND TOUCH PANEL USING THE SAME," filed on Sep. 29, 2011, and application Ser. No. 13/340,134.

BACKGROUND

1. Technical Field

The present disclosure relates to a transparent conductive film and a touch panel using the same.

2. Description of Related Art

The main component of touch panels are transparent conductive films as touch sensing mediums. Materials such as indium tin oxide (ITO), stannic oxide ($SnO_2$), and zinc oxide (ZnO) are commonly used transparent conductive film materials. ITO has been widely used in the touch panels because it has a high light transmittance, good conductivity, and easily etched.

However, the touch panels can only detect a single touch at one time, and a detecting precision is relatively low.

What is needed, therefore, is to provide a transparent conductive film and a touch panel using the transparent conductive film which can realize multi-touch detecting and can improve the detecting precision of touch points operated thereon.

BRIEF DESCRIPTION OF THE DRAWING

Many aspects of the present disclosure can be better understood with reference to the following drawings. The components in the drawings are not necessarily to scale, the emphasis instead being placed upon clearly illustrating the principles of the present embodiments.

DETAILED DESCRIPTION

The disclosure is illustrated by way of example and not by way of limitation in the figures of the accompanying drawings in which like references indicate similar elements. It should be noted that references to "another," "an," or "one" embodiment in this disclosure are not necessarily to the same embodiment, and such references mean at least one.

Figure 1:
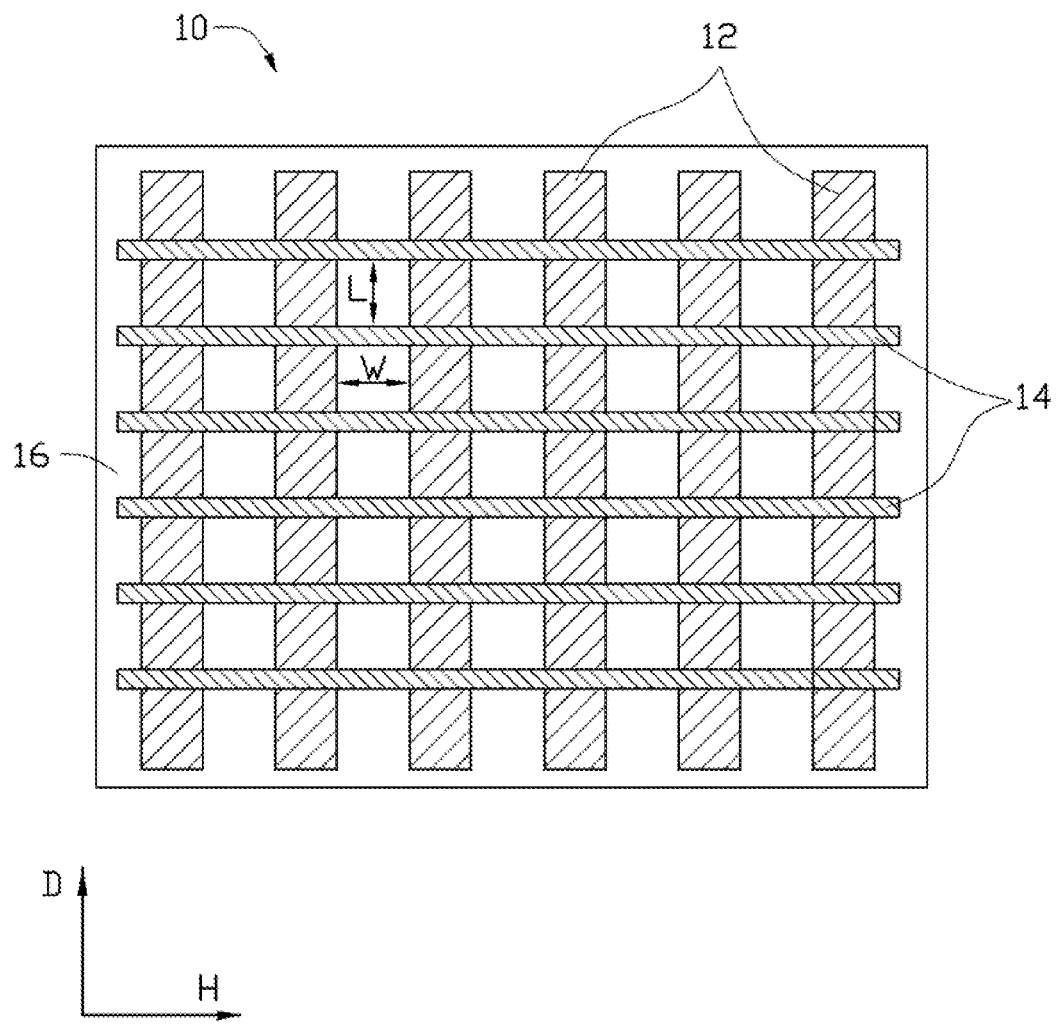
FIG. 1 is a top view of a transparent conductive film of Example 1.

Referring to FIG. 1, one embodiment of a transparent conductive film 10 includes a plurality of transparent conductive stripes connected with each other and extending along different directions. The plurality of transparent conductive stripes are arranged in patterns such that the transparent conductive film 10 can have an anisotropic impedance. Anisotropic impedance means that the transparent conductive film 10 has different impedances along different directions substantially parallel with a surface of the transparent conductive film 10. The extending directions of the plurality of transparent conductive stripes are substantially parallel with the surface of the transparent conductive film 10. The plurality of transparent conductive stripes can include a plurality of first transparent conductive stripes 12 and a plurality of second transparent conductive stripes 14. The plurality of first transparent conductive stripes 12 are spaced from each other and extend substantially along a first direction. The plurality of second transparent conductive stripes 14 are spaced from each other and extend substantially along a second direction. The plurality of second transparent conductive stripes 14 are stacked and intersect the plurality of first transparent conductive stripes 12. One of the first direction and the second direction can be a low impedance direction D. A resistivity of the transparent conductive film 10 in the low impedance direction D is smaller than the resistivity in the other direction. The term "direction" in the present disclosure refers to a direction substantially parallel with the surface of the transparent conductive film 10.

The transparent conductive film 10 has different resistivities in different directions because the transparent conductive film 10 has different microstructures electrically connected with each other in different directions. These microstructures have different resistances, thus the transparent conductive film 10 has an anisotropic impedance. These microstructures can be the plurality of transparent conductive stripes. The plurality of transparent conductive stripes has different resistances in different directions.

One of the first direction and the second direction is the low impedance direction D, and the other direction can be a high impedance direction H. The resistivity of the transparent conductive film 10 in the high impedance direction H is greater than the resistivity in any other direction. The transparent conductive film 10 is conductive in any direction.

A resistivity ratio of the transparent conductive film 10 in the low impedance direction D and high impedance direction H can be about 1:30 to about 1:1000. In one embodiment, the resistivity ratio is about 1:50 to about 1:200. An intersection angle of the low impedance direction D and the high impedance direction H can be in a range from about 10 degrees to about 90 degrees. In one embodiment, the low impedance direction D is substantially perpendicular to the high impedance direction H.

The plurality of transparent conductive stripes electrically connected with each other and extending along different directions can be a multi-layer structure. Each layer of the multi-layer structure can include a plurality of one-dimensional transparent conductors. Adjacent layers in the multi-layer structure are directly stacked with each other. The plurality of one-dimensional transparent conductors in one layer of the multi-layer structure can be spaced with each other and extend substantially along the first direction to give the transparent conductive film 10 the anisotropic impedance property. The plurality of one-dimensional transparent conductors in other layers of the multi-layer structure can intersect each other and extend along other directions as long as the resistivity of the transparent conductive film 10 along a single direction is greater than the resistivity along other directions. In one embodiment, the multi-layer structure includes two layers. One of the two layers includes the plurality of first transparent conductive stripes 12 spaced from each other and extending substantially along the first direction. The other one of the two layers includes the plurality of second transparent conductive stripes 14 spaced from each other and extending substantially along the second direction. The two layers are directly stacked with each other such that the plurality of second transparent conductive stripes 14 electrically contact and intersect the plurality of first transparent conductive stripes 12. In other words, the spaced first transparent conductive stripes 12 are electrically connected with each other via one or all of the plurality of second transparent conductive stripes 14. In one embodiment, each of the plurality of second transparent conductive stripes 14 electrically contact and intersect each of the plurality of first transparent conductive stripes 12, and each of the plurality of first transparent conductive stripes 12 electrically contact and intersect each of the plurality of second transparent conductive stripes 14.

The plurality of first transparent conductive stripes 12 and the plurality of second transparent conductive stripes 14 in the extending direction intersect each other along a direction substantially parallel with the surface of the transparent conductive film 10 at a certain angle. In one embodiment, the angle is in accord with the angle of the low impedance direction D and the high impedance direction H.

The term "stack" means that the plurality of first transparent conductive stripes 12 can be overlapped or woven with the plurality of second transparent conductive stripes 14. Referring to FIG. 1, the term "overlapped" means that the transparent conductive film 10 can be a two-layer structure. One layer consisting primarily of all first transparent conductive stripes 12, and the other layer consisting primarily of all second transparent conductive stripes 14. The layer consisting primarily of all first transparent conductive stripes 12 are disposed on a surface of the layer consisting primarily of all second transparent conductive stripes 14. In other words, all first transparent conductive stripes 12 are disposed on a same surface of the layer consisting of the plurality of second transparent conductive stripes 14.

Figure 2:
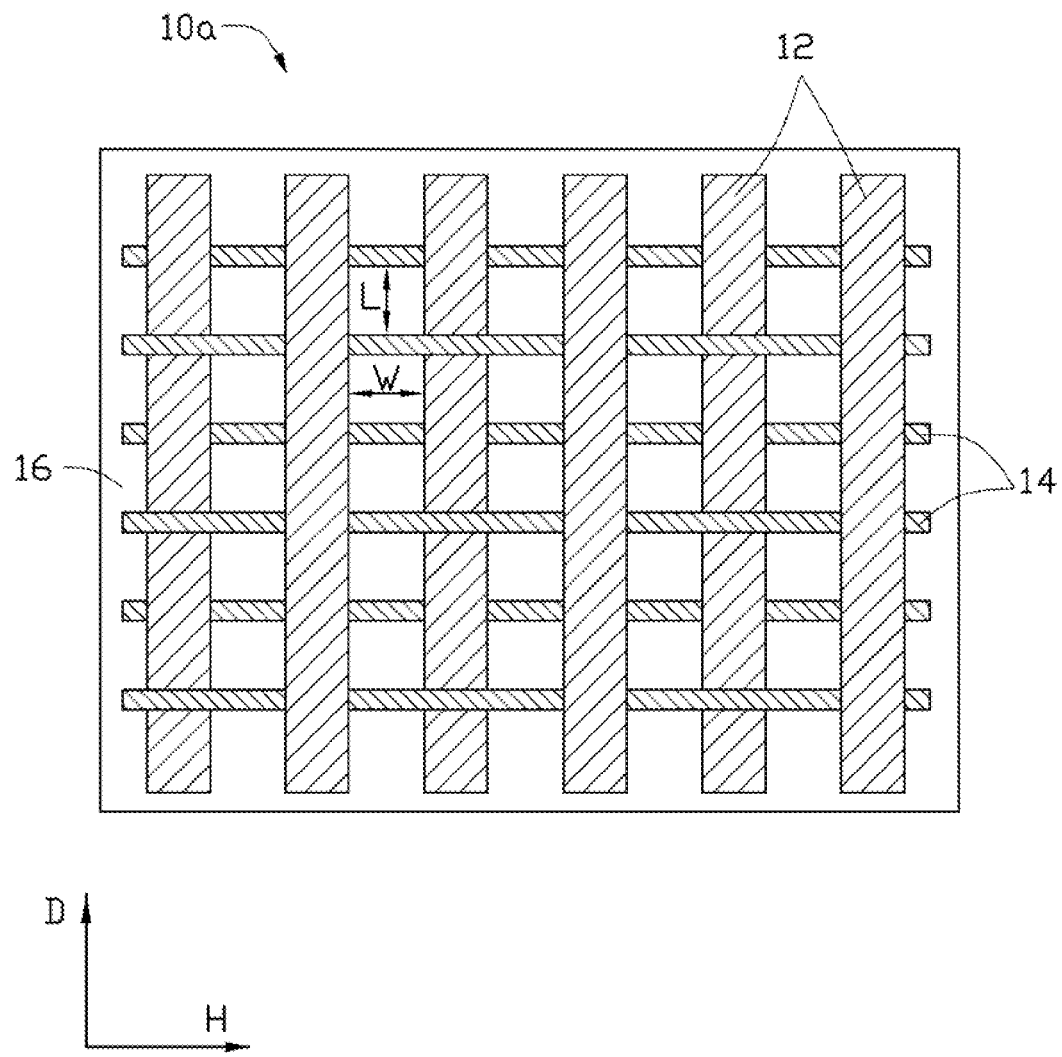
FIG. 2 is a top view of an embodiment of the transparent conductive film in which a plurality of first transparent conductive stripes are woven with a plurality of second transparent conductive stripes.

Referring to FIG. 2, the term "woven" means that the transparent conductive film 10a is the multi-layer structure. In the multi-layer structure, the plurality of first transparent conductive stripes 12 are distributed in different layers, the plurality of second transparent conductive stripes 14 are distributed in the different layers, and each layer of the multi-layer structure only includes one of the first transparent conductive stripes and the second transparent conductive stripes. For example, the plurality of first transparent conductive stripes 12 can be disposed on two opposite surfaces of the layer consisting primarily of parts or all of the spaced second transparent conductive stripes 14. The plurality of second transparent conductive stripes 14 can be disposed on two opposite surfaces of the layer consisting primarily of parts or all of the spaced first transparent conductive stripes 12. The multi-layer structure can be formed by various methods. In one embodiment, the multi-layer structure can be formed by arranging parts of the plurality of first transparent conductive stripes 12 on a surface of the substrate to form a first layer, then arranging and stacking parts of the plurality of second transparent conductive stripes 14 on a surface of the first layer to form a second layer. Other parts of first transparent conductive stripes 14 are then disposed on a surface of the second layer. This is repeated until the plurality of first transparent conductive stripes 12 are woven with the plurality of second transparent conductive stripes 14.

In one embodiment, carbon nanotubes are used to form the woven structure. Each of the plurality of first transparent conductive stripes 12 can be a carbon nanotube drawn film including a plurality of carbon nanotubes, and each of the plurality of second transparent conductive stripes 14 can be a carbon nanotube yarn including a plurality of carbon nanotubes. A majority of carbon nanotubes in the carbon nanotube drawn film and carbon nanotube yarn are joined end to end by van der Waals attractive forces and extend substantially along a same direction. The extending direction of each of the plurality of first transparent conductive stripes 12 and each of the plurality of second transparent conductive stripes 14 are in accordance with the extending direction of the majority of carbon nanotubes. The carbon nanotube drawn film and the carbon nanotube yarn can be formed by drawing from a carbon nanotube array. A width of the carbon nanotube drawn film is greater than the width of the carbon nanotube yarn such that the resistivity of the carbon nanotube drawn film along the extending direction is smaller than the resistivity of the carbon nanotube yarn along the extending direction.

Each of the carbon nanotube drawn film and the carbon nanotube yarn is capable of forming a free-standing structure. The term "free-standing structure" can be defined as a structure that does not need to be supported by a substrate. For example, a free standing structure can sustain the weight of itself when it is hoisted by a portion thereof without any significant damage to its structural integrity. So, if the carbon nanotube drawn film or the carbon nanotube yarn is placed between two separate supporters, a portion of the carbon nanotube drawn film or the carbon nanotube yarn, not in contact with the two supporters, would be suspended between the two supporters and yet maintain film or yarn structural integrity. The free-standing structure of the carbon nanotube drawn film and the carbon nanotube yarn is realized by the successive carbon nanotubes joined end to end by van der Waals attractive forces The transparent conductive film 10a having the carbon nanotubes, with the woven structure can be formed by the following steps:

A1, laying a plurality of the carbon nanotube drawn films along the first direction to form the first layer;

A2, laying and stacking a plurality of the carbon nanotube yarns on a surface of the first layer along the second direction to form the second layer;

A3, repeating the steps A1 and A2 to form the transparent conductive film 10a with the woven structure.

Materials of the plurality of first transparent conductive stripes 12 and the plurality of second transparent conductive stripes 14 can be the same or different as long as the resistivity of the transparent conductive films 10 in the low impedance direction D is smaller than the resistivity in other directions. If the materials are the same, the lengths or widths of the plurality of first transparent conductive stripes 12 and the plurality of second transparent conductive stripes 14 are different so that the plurality of first transparent conductive stripes 12 and the plurality of second transparent conductive stripes 14 have different resistances along the extending directions. If the materials are different, the materials with different conductivity can be used to form the plurality of first transparent conductive stripes 12 and the plurality of second transparent conductive stripes 14. The plurality of first transparent conductive stripes 12 and the plurality of second transparent conductive stripes can have different impedance along the extending directions using different materials. In addition, the lengths and widths of the plurality of the conductive stripes can be further varied to increase the impedance differences of the transparent conductive film 10 in different directions. In another embodiment, the number of the conductive stripes in one direction can be much greater than the number of the conductive stripes in other directions to give the transparent conductive film 10 an isotropic impedance property.

Referring to FIG. 1, in one embodiment, the first direction is the low impedance direction D, and the second direction is the high impedance direction H. The plurality of first transparent conductive stripes 12 have a high conductivity in the lengthwise direction and substantially extend along the low impedance direction D. The plurality of second transparent conductive stripes 14 have a low conductivity in the lengthwise direction and substantially extend along the high impedance direction H. Impedances of the plurality of first transparent conductive stripes 12 are much smaller than the impedances of the transparent conductive film 10 in other directions. The impedances of the plurality of second transparent conductive stripes 14 are much greater than the impedances of the transparent conductive film 10 in other directions. There are overlapping regions between the plurality of first transparent conductive stripes 12 and the plurality of second transparent conductive stripes 14. In one embodiment, each of the plurality of first transparent conductive stripes 12 has overlapping regions with each of the plurality of second transparent conductive stripes 14, and each of the plurality of second transparent conductive stripes 14 has overlapping regions with each of the plurality of first transparent conductive stripes 12. In one embodiment, the material of the plurality of first transparent conductive stripes 12 and the plurality of second transparent conductive stripes are substantially the same. Each of the plurality of first transparent conductive stripes 12 is long in the lengthwise direction or has a large width to have a low impedance, and each of the plurality of second transparent conductive stripes 14 is short in the lengthwise direction or has a small width to have a high impedance. A width ratio of each of the first transparent conductive stripes 12 and each of the second transparent conductive stripes 14 can be in a range from about 100:1 to about 500:1. In one embodiment, the material of the plurality of first transparent conductive stripes 12 and the plurality of second transparent conductive stripes 14 are different. A material with a high conductivity can be used to fabricate the plurality of first transparent conductive stripes 12 extending along the low impedance direction D. A material with a low conductivity can be used to fabricate the plurality of second transparent conductive stripes 14 extending along the high impedance direction H. In addition, the length or width of the plurality of first transparent conductive stripes 12 and the plurality of second transparent conductive stripes 14 can vary with the materials thereof at the same time to increase the anisotropic impedance of the transparent conductive film 10.

The material of the plurality of first transparent conductive stripes 12 and the plurality of second transparent conductive stripes 14 can be a transparent conductive material. The transparent conductive material can be a metal oxide, a metal nitride, a metal fluoride, a conductive polymer, a carbon containing material, or combinations thereof. The metal oxide can include a single metal element such as stannic oxide ($SnO_2$), zinc oxide, cadmium oxide (CdO), or indium oxide ($In_2O_3$). The metal oxide also can include two or more metal elements such as indium tin oxide (ITO), indium zinc oxide (IZO), gallium zinc oxide (GZO), aluminum zinc oxide (AZO). The metal oxide can be a mixture of at least two metal oxides such as $In_2O_3$—ZnO, $CdIn_2O_4$, $Zn_2SnO_4$, or combinations thereof. The metal nitride can be titanium nitride (TiN). The metal fluoride can be fluoride mixed stannic oxide. The conductive polymer can be poly(3,4-ethylenedioxythiophen) (PEDOT) or a composition of PEDOT and polystyrene sulfonate (PEDOT-PSS). The carbon containing material can be graphene or carbon nanotubes. One of the plurality of first transparent conductive stripes 12 and the plurality of second transparent conductive stripes 14 can be a transparent graphene sheet or a carbon nanotube transparent conductive film. The carbon nanotube transparent conductive film can be a transparent conductive film consisting primarily of carbon nanotubes, such as the carbon nanotube drawn film, or a composite film including the carbon nanotubes and other transparent conductive materials. In one embodiment, the material of the plurality of first transparent conductive stripes 12 is ITO, and the carbon nanotube drawn films are used as the plurality of second transparent conductive stripes 14.

Figure 3:
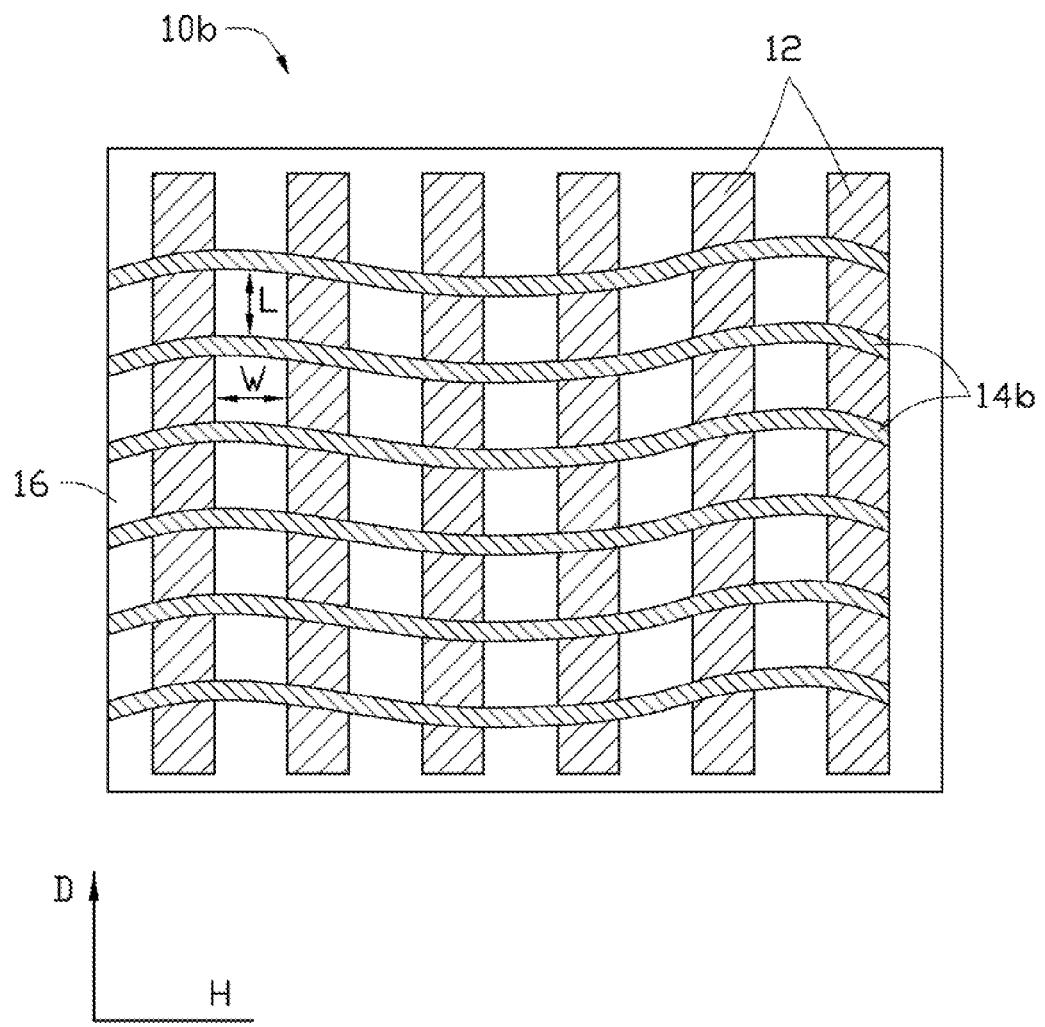
FIG. 3 is a top view of an embodiment of the transparent conductive film including a plurality of waved second transparent conductive stripes.
Figure 4:
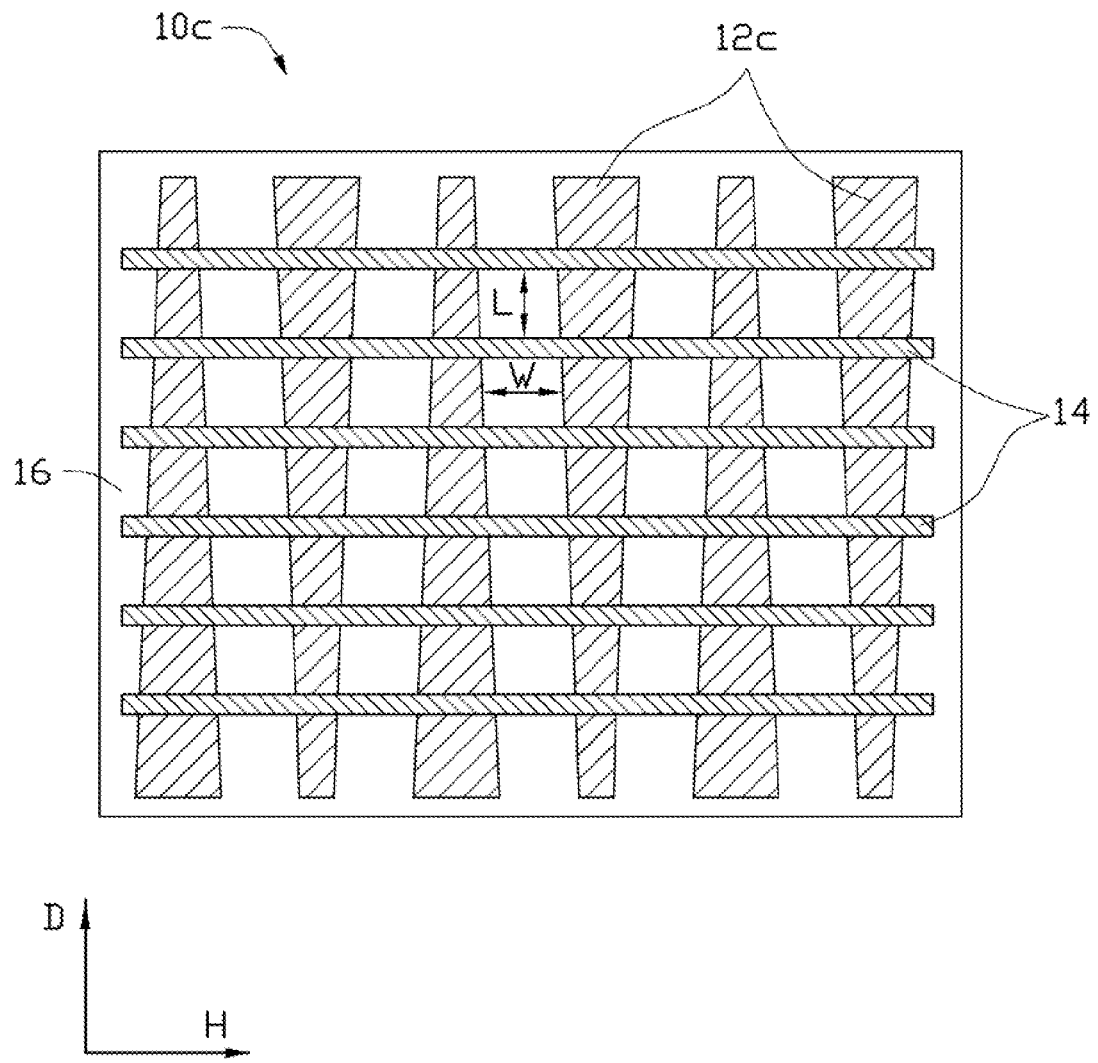
FIG. 4 is a top view of an embodiment of the transparent conductive film including a plurality of first transparent conductive stripes with varied widths.
Figure 5:
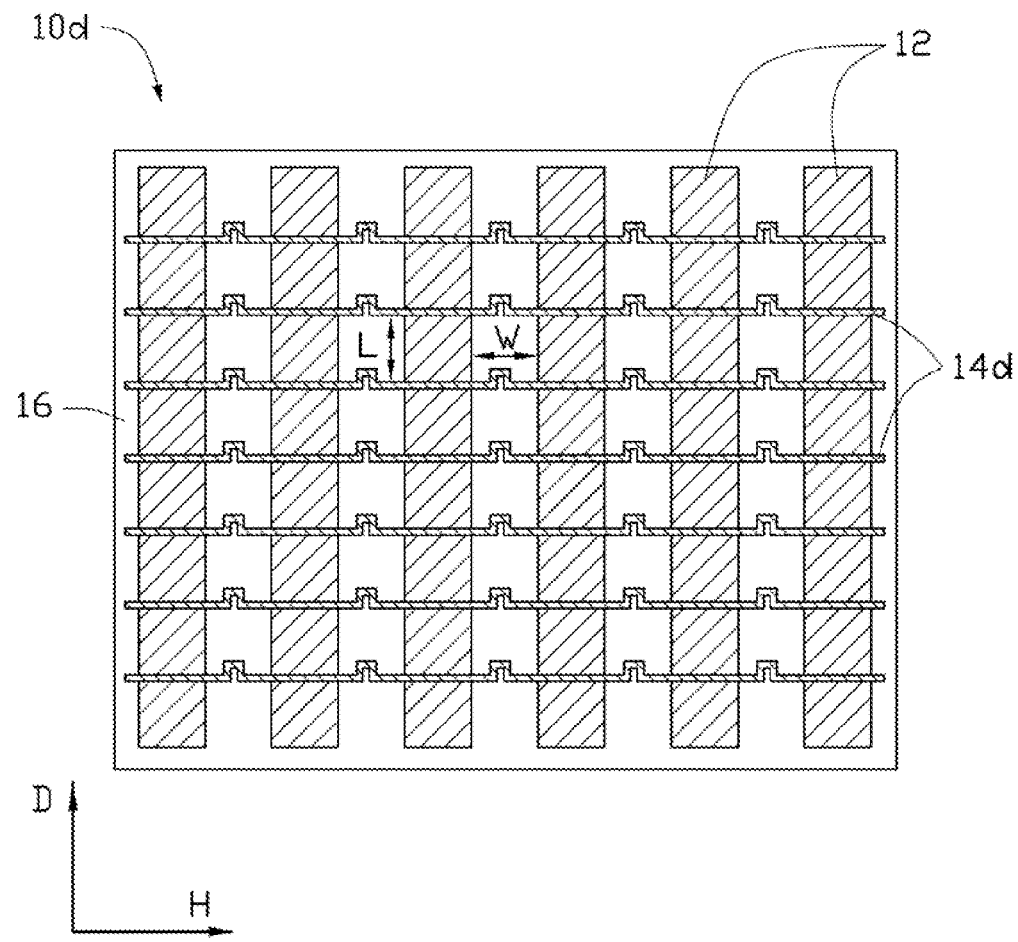
FIG. 5 is a top view of the transparent conductive film of Example 2.

The plurality of first transparent conductive stripes 12 and the plurality of second transparent conductive stripes 14 can have various shapes as long as the resistivity of the transparent conductive film 10 along the low impedance direction D is much smaller the resistivity in any other direction. At least one of the plurality of first transparent conductive stripes 12 and the plurality of second transparent conductive stripes 14 can be a straight stripe, a square wave stripe, a waved stripe, a zigzag stripe, a stepped shaped stripe, or a cambered stripe. Referring to FIG. 1, in one embodiment, each of the plurality of first transparent conductive stripes 12 and the plurality of second transparent conductive stripes 12 is the straight stripe. Referring to FIG. 3, in one embodiment of the transparent conductive film 10b, each of the plurality of first transparent conductive stripes 12 is the straight stripe, and each of the plurality of second transparent stripes 14b is the cambered stripe. Referring to FIG. 5, in one embodiment of the transparent conductive film 10d, each of the plurality of first transparent conductive stripes 12 is the straight stripe, and each of the plurality of second transparent stripes 14d is the rectangle wave stripe. Each of the plurality of first transparent conductive stripes 12 and each of the plurality of second transparent conductive stripes 14 can have a substantially equal width or a varied width. Referring to FIG. 4, in one embodiment of the transparent conductive film 10c, each of the plurality of first transparent conductive stripes 12c has the varied width. The shapes of the plurality of first transparent conductive stripes 12 and the plurality of second transparent conductive stripes 14 can be substantially the same or different. A conductive or impedance diversity of the transparent conductive film 10 in the different directions can be increased by varying the shapes of the first transparent conductive stripes 12 and the second transparent conductive stripes 14.

A distance between adjacent second transparent conductive stripes 14 or adjacent first transparent conductive stripes 12 can be substantially the same or varied. The distance between adjacent first transparent conductive stripes 12 and adjacent second transparent conductive stripes 14 may be set so as not to be visually sensed. As shown in FIG. 1, the distance between two adjacent first transparent conductive stripes 12 is labeled with W, and the distance between two adjacent second transparent conductive stripes 14 is labeled with L. In one embodiment, adjacent first transparent conductive stripes 12 and adjacent second transparent conductive stripes 14 are disposed with substantially equal distances. W can be less than or equal to about 50 micrometers. In one embodiment, W is about 30 micrometers. L can be less than or equal to about 10 micrometers. In one embodiment, L is about 5 micrometers.

The distances W, L, and the width ratio of the first transparent conductive stripe 12 and the second transparent conductive stripe 14 can be varied according to different applications or properties of the transparent conductive film 10, such as the size of the touch panel.

Figure 6:
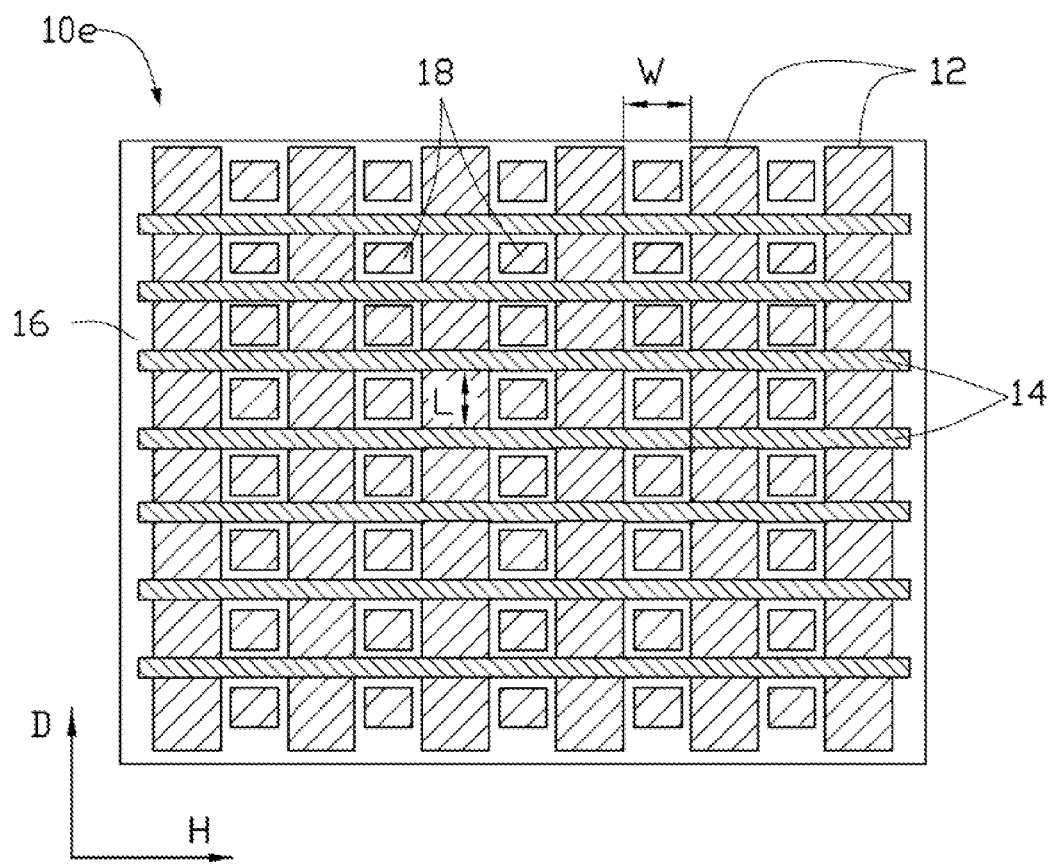
FIG. 6 is a top view of the transparent conductive film of Example 3.

Referring to FIG. 6, the transparent conductive film 10e can include a plurality of optical compensation films 18 disposed between the adjacent first transparent conductive stripes 12 or the adjacent second transparent conductive stripes 14. Each optical compensation film 18 is spaced from each first transparent conductive stripe 12 and each second transparent conductive stripe 14. Each optical compensation film 18 can be a continuous film or a plurality of continuous sub-optical-films spaced from each other. The plurality of first transparent conductive stripes 12 and the plurality of second transparent conductive stripes 14 cannot be visually sensed easily by disposing the plurality of optical compensation films 18. The plurality of optical compensation films 18 can have similar transmittance and use the same material with the plurality of first transparent conductive stripes 12 and the plurality of second transparent conductive stripes 14. The shapes of the plurality of optical compensation films 18 is not limited as long as each of the plurality of optical compensation films 18 is insulated with the plurality of first transparent conductive stripes 12 and the plurality of second transparent conductive stripes 14. In one embodiment, the shape of each optical compensation film 18 is a rectangle. The plurality of optical compensation films 18 can be formed by patterning with the plurality of first transparent conductive stripes 12 and the plurality of second transparent conductive stripes 14 at the same time or disposed separately.

The plurality of transparent conductive stripes connected with each other along the different directions can be formed at the same time or separately by various patterning methods. The patterning methods can be screen printing or photo etching according to the patterns. The method can include the following steps:

S1, providing a substrate 16;
S2, forming the plurality of first transparent conductive stripes 12 spaced from each other and extending substantially along the first direction on a surface of the substrate;
S3, forming the plurality of second transparent conductive stripes 14 spaced from each other and extending substantially along the second direction on a surface of the plurality of first transparent conductive stripes 12 to form the transparent conductive film 10.

In step S1, the substrate 16 is a supporting component and can be a transparent substrate. A material of the transparent substrate can be a glass or transparent polymer. The transparent polymer can be polymethylmethacrylate (PMMA), polyethylene terephthalate (PET), polycarbonate (PC), or combinations thereof.

In step S2, the low impedance direction D can be predefined to confirm the structures of the plurality of first transparent conductive stripes 12 and the plurality of second transparent conductive stripes 14. The structures can include shapes, materials, lengths, and widths. The plurality of first transparent conductive stripes 12 can be formed by screen printing the transparent conductive materials on the surface of the substrate 16.

In addition, the transparent conductive materials can be coated on the surface of the substrate 16 and then patterned to form the plurality of first transparent conductive stripes 12. The transparent conductive materials can be coated on the surface of the substrate 16 by a method such as vacuum evaporation, sputtering, ion plating, vacuum plasma CVD, spray pyrolysis, thermal CVD, or sol-gel. In one embodiment, ITO is sputtered on the surface of the substrate 16 and then patterned to form the plurality of first transparent conductive stripes 12. The transparent conductive materials are patterned to form the plurality of optical compensation films 18 along with the first transparent conductive stripes 12. The patterning method can include bump transfer printing, wet etching, dry etching, laser etching, shave removing, or tape peeling.

The method of the shave removing is conducted by shaving unwanted parts in the transparent conductive materials on the surface of the substrate 16 using a tool such as a blade or file. The method of the tape peeling is conducted by adhering the tape on the unwanted parts of the transparent conductive materials on the surface of the substrate 16, and peeling the tape. The unwanted parts of the transparent conductive materials will adhere on the peeled tape and the transparent conductive materials can be patterned into the desired first transparent conductive stripes 12. The method of the laser etching is conducted by ablating the unwanted parts of the transparent conductive materials using a laser. The methods of wet etching and dry etching can be conducted by putting desired pattern-photoresist on the surface of the transparent conductive materials disposed on the surface of substrate 16 by photolithography, and ion bombarding or liquid etching the unwanted parts of the transparent conductive materials to form the first transparent conductive stripes 12. The method of bump transfer printing can be conducted by designing a mold having the shape of the unwanted parts of the layer, adhering the mold on the surface of the transparent conductive materials disposed on the surface of substrate 16, and peeling the mold to leave the desired pattern on the substrate 16. In one embodiment, the plurality of first transparent conductive stripes 12 and the plurality of optical compensation films 18 are patterned by laser etching.

In step S3, in one embodiment, the plurality of second transparent conductive stripes 14 can be screen printed on the surface of the plurality of first transparent conductive stripes 12 to form the transparent conductive film 10. In one embodiment, a plurality of the carbon nanotube drawn films are laid spaced apart on the surface of the plurality of first transparent conductive stripes 12 substantially along the second direction to form the plurality of second conductive stripes 14.

The following examples further illustrate the transparent conductive film 10 and the method for making thereof, wherein the first direction is the low impedance direction D, and the second direction is the high impedance direction H.

EXAMPLE 1

The transparent conductive materials ITO are sputtered on the surface of the substrate of PET to form a transparent conductive layer. The transparent conductive layer is laser etched to form the plurality of first transparent conductive stripes 12 along the low impedance direction D. Each of the plurality of first transparent conductive stripes 12 is the straight stripe and has substantially the same width. A carbon nanotube array is provided. The carbon nanotube array is drawn several times to obtain a plurality of the carbon nanotube drawn films with substantially the same widths. The plurality of the carbon nanotube drawn films are laid spaced apart on the surface of the laser etched transparent conductive layer substantially along the high impedance direction H to form the transparent conductive film 10. Referring to FIG. 1, the plurality of first transparent conductive stripes 12 are substantially perpendicular to the plurality of second transparent conductive stripes 14. The distance W is about 30 micrometers, and the distance L is about 5 millimeters.

EXAMPLE 2

Referring to FIG. 5, the transparent conductive film 10d is fabricated by the same method as in Example 1, except that each of the second transparent conductive stripes 14d is the square wave stripe to increase the resistivity thereof. In addition, a carbon nanotube ink is used to form the plurality of second transparent conductive stripes 14d by screen printing.

EXAMPLE 3

Referring to FIG. 6, the transparent conductive film 10e is fabricated by the same method as in Example 1, except that the plurality of optical compensation films 18 are laser etched along with the plurality of first transparent conductive stripes 12.

One embodiment of a touch panel includes at least one transparent conductive film 10, a substrate, and a plurality of electrodes. The at least one transparent conductive film 10 is disposed on a surface of the substrate and on a range capable of sensing the touch points on the touch panel. The plurality of electrodes are spaced from each other and electrically connected with the at least one transparent conductive film 10. In one embodiment, the plurality of electrodes are disposed on one side or two opposite sides of the touch panel. The one or two opposite sides are substantially perpendicular to the low impedance direction D.

The touch panel can be a resistive touch panel or a capacitive touch panel. The touch panel can realize a multi-touch detecting by using the transparent conductive film 10. In addition, signals detected from the plurality of electrodes before and after touching on the touch panel vary because of the anisotropic impedance of the transparent conductive film 10. Therefore, position coordinates of the touch points can be easily detected, and a precision of the detection is improved.

Figure 7:
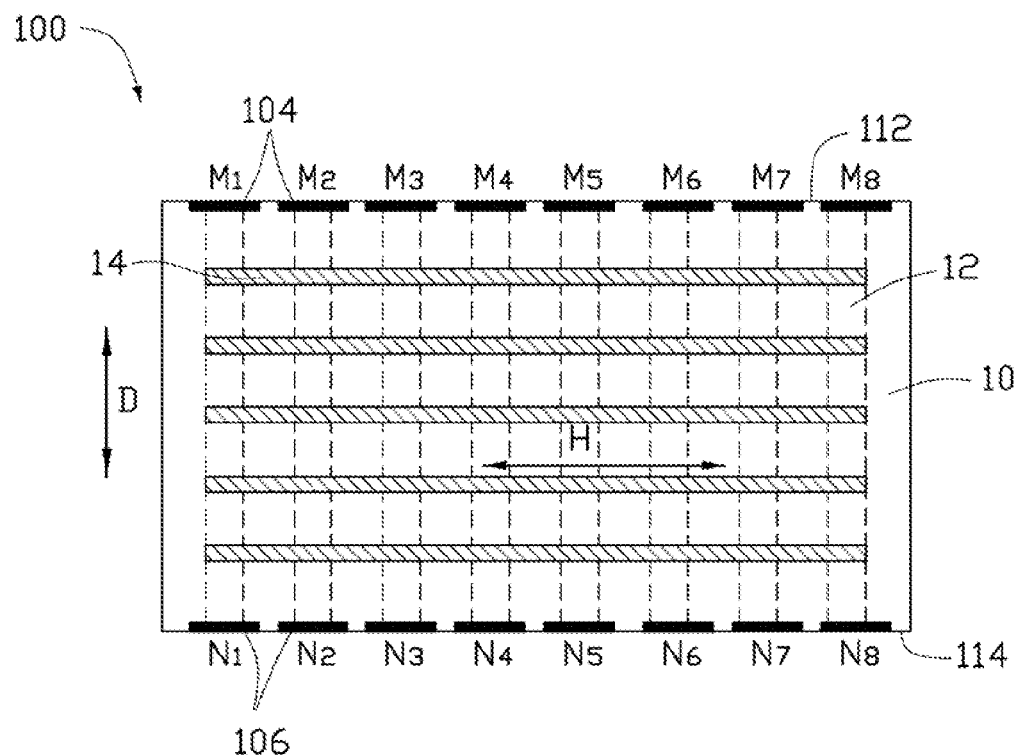
FIG. 7 is a schematic structural top view of an embodiment of a touch panel.
Figure 8:
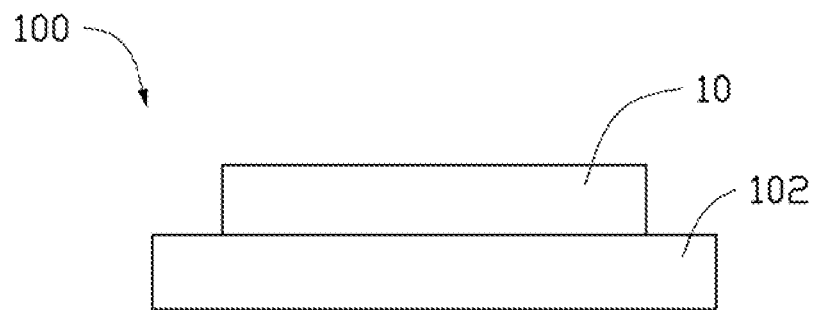
FIG. 8 is a side view of a structure of the touch panel.

Referring to FIG. 7 and FIG. 8, one embodiment of a surface capacitive touch panel 100 using a single transparent conductive film 10 is provided. The touch panel 100 includes a substrate 102, the single transparent conductive film 10, and a plurality of first electrodes 104 and a plurality of second electrodes 106. The transparent conductive film 10 is disposed on a surface of the substrate 102. The plurality of first electrodes 104 and the plurality of second electrodes 106 are disposed on two opposite sides of the transparent conductive film 10. Both of the two opposite sides are substantially perpendicular to the low impedance direction D of the transparent conductive film 10. The side of the transparent conductive film 10 with the plurality of first electrodes disposed thereon is defined as a first side 112, and the side of the transparent conductive film 10 with the plurality of second electrodes disposed thereon is defined as a second side 114. Each of the plurality of first electrodes 104 corresponds to each of the plurality of second electrodes 106 along the low impedance direction D.

In one embodiment, the transparent conductive film 10 of FIG. 1 is used in the touch panel 100. The number of the plurality of first transparent conductive stripes 12 can be greater than or equal to the number of the plurality of first electrodes 104 or the plurality of second electrodes 106. In one embodiment, the number of the plurality of first transparent conductive stripes 12 is equal to the number of the plurality of first electrodes 104 and the number of the plurality of second electrodes 106. One end of the first transparent conductive stripe 12 along the extending direction is electrically connected with one first electrode 104, and the other end along the extending direction is electrically connected with one second electrode 106. The plurality of first electrodes 104 and second electrodes 106 can be driving electrodes used for inputting driving signals to drive the touch panel 100 and can be sensing electrodes used for detecting sensed signals. A driving and sensing process can be realized by a control circuit in the touch panel 100.

When a conductor, such as fingers or other conductors, touches the touch panel 100, a coupling capacitance can be generated between the conductor and the transparent conductive film 10. The coupling capacitance will cause a signal variation detected from the first electrodes 104 and second electrodes 106 before and after touching. The touch points can be detected according to the signal variation. The touch points can be detected according to the following steps:

B1, providing a driving signal to each of the plurality of first electrodes 104 and each of the plurality of second electrodes 106;

B2, touching the touch panel 100 by using the conductor to generate the coupling capacitance;

B3, detecting sensed signals from the plurality of first electrodes 104 and the plurality of second electrodes 106; and B4, calculating position coordinates of the touch points by analyzing the sensed signals.

In step B1, the driving signal can be voltage or current. In one embodiment, the driving signal is voltage.

In step B3, the sensed signals can be voltage, current, electric quantity, capacity, or a variation value thereof before and after touching. In one embodiment, the sensed signals are represented by a variation value curve of the voltage. The variation value curve includes a plurality of voltage variation value before and after touching the touch panel 100. The variation value curve of the voltage detected from the plurality of first electrodes 104 is defined as a first curve, and the variation value curve of the voltage detected from the plurality of second electrodes 106 is defined as a second curve.

In step B4, the position coordinates of the touch points can be calculated according to the sensed signals obtained before and after touching the touch panel 100. In one embodiment, a method for calculating the position coordinates of the touch points acted on the touch panel 100 includes the following steps:

B41, calculating the position coordinates of the touch points in the high impedance direction H according to the first curve or the second curve; and B42, calculating the position coordinates of the touch points in the low impedance direction D according to the first curve and the second curve.

Figure 9:
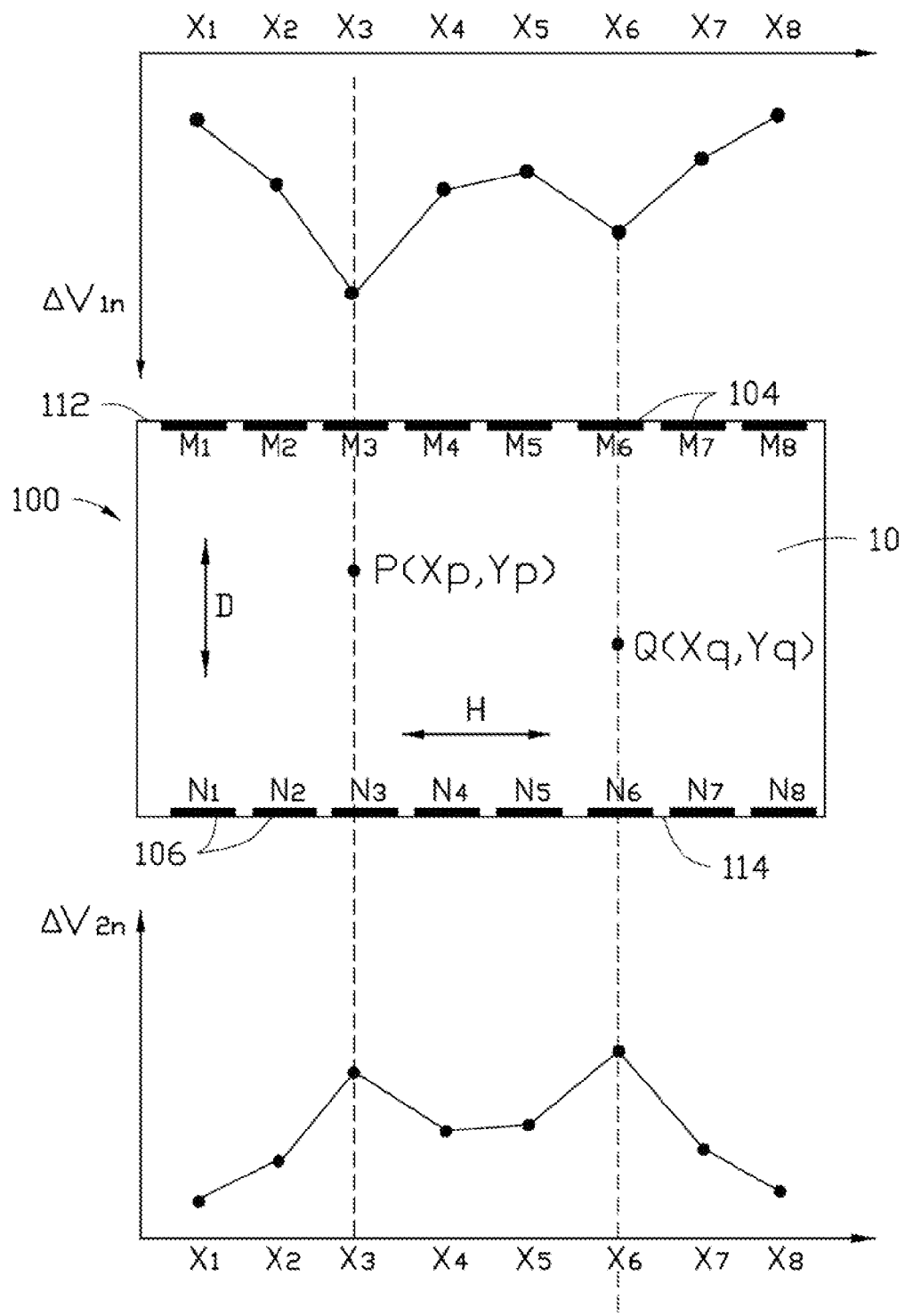
FIG. 9 is a chart showing variation value curves of voltage of touch points acted on the touch panel.

Referring to FIG. 9, a schematic figure about the first curve and the second curve is provided. Parameters and labels are clarified first. P and Q represent two touch points acted on the touch panel 100 at the same time. The position coordinates of touch point P is represented by $(x_p, y_p)$, and the position coordinates of the touch point Q is represented by $(x_q, y_q)$. $y_p$ represents a distance perpendicular from the touch point P to the first side 112, and $y_q$ represents a distance perpendicular from the touch point Q to the first side 112. The plurality of first electrodes 104 are labeled as $M_1, M_2, M_3, M_4, M_5, M_6, M_7$, and $M_8$. The plurality of second electrodes 106 are labeled as $N_1, N_2, N_3, N_4, N_5, N_6, N_7$, and $N_8$. The position coordinates of the plurality of first electrodes 104 and the plurality of second electrodes 106 in the high impedance direction H are orderly labeled as $X_1, X_2, X_3, X_4, X_5, X_6, X_7$, and $X_8$. $\Delta V_{1i}$ represents the variation value of the voltage detected from the first electrode $M_i$ before and after touching the touch panel 100. $\Delta V_{2i}$ represents the variation value of the voltage detected from the second electrode $N_i$ before and after touching the touch panel 100, wherein i represents a number order of the first or second electrode, and i=1, 2, ... 8.

(1) Confirming the Position Coordinates of the Touch Points P and Q in the High Impedance Direction H The position coordinates of the touch points P and Q in the high impedance direction H can be obtained from the first curve and the second curve. In one embodiment, one or more peak values in the first curve are found to calculate the position coordinates of the touch points P and Q in the high impedance direction H. Referring to FIG. 9, the variation value $\Delta V_{13}$ detected from the $M_3$ and the variation value $\Delta V_{16}$ detected from the $M_6$ are two peak values in the first curve. $M_3$ corresponds to the coordinate $x_3$ and $M_5$ corresponds to the coordinate $X_5$. Therefore, the position coordinates $x_p$ and $x_q$ of the touch points P and Q can be directly judged from the first curve: $x_p=X_3$, and $x_q=X_5$. In addition, the variation values detected from the electrodes adjacent to the electrodes in which the peak values are detected can be used to calculate the position coordinates of the touch points for a better precision. For example, $M_2$ and $M_4$ are adjacent to $M_3$, the position coordinate $x_p$ of the touch point P can be calculated by a formula:

$$x_p = \frac{X_2 \, \Delta V_{12} + X_4 \Delta V_{14}}{\Delta V_{12} + \Delta V_{14}},$$

Correspondingly, the position coordinate $x_q$ can be calculated by a formula:

$$x_q = \frac{X_5 \, \Delta V_{15} + X_7 \Delta V_{17}}{\Delta V_{15} + \Delta V_{17}}.$$

(2) Confirming the Position Coordinates of the Touch Points P and Q in the Low Impedance Direction D The one or more peak values in the first curve and in the second curve are found to calculate the position coordinates of the touch points P and Q in the low impedance direction D. The transparent conductive film 10 has an anisotropic impedance property. The closer the touch points to the first electrodes 104 or the second electrodes 106 in the low impedance direction D, the greater the variation values detected from the corresponding first electrodes 104 or the corresponding second electrodes 106.

Referring to FIG. 9, taking touch point P for example, a distance from the touch point P to the first electrode $M_3$ is smaller than the distance to the second electrode $N_3$, so the peak variation value $\Delta V_{13}$ is greater than the peak variation value $\Delta V_{23}$. The variation value is inversely proportional to the distance from the touch point to the corresponding first electrode 104 or second electrode 106. The position coordinate $y_p$ can be calculated by a formula:

$$y_p = \frac{\Delta V_{23}}{\Delta V_{13} + \Delta V_{23}} \times K,$$

wherein K represents a distance perpendicular from the first side 112 to the second side 114. In addition, the variation values detected from the electrodes adjacent to the electrodes from which the peak values were detected can be used to calculate the position coordinates of the touch points in the low impedance direction D for a better precision. For example, the position coordinate $y_p$ can be represented by:

$$y_p = \frac{\Delta V_{22} + \Delta V_{23} + \Delta V_{24}}{\Delta V_{13} + \Delta V_{23} + \Delta V_{12} + \Delta V_{22} + \Delta V_{14} + \Delta V_{24}} \times K.$$

Other formulas can also be used to calculate the position coordinates of the touch points P and Q. The above method can detect two more touch points.

If the transparent conductive film 10 has a good anisotropic impedance, a resistance diversity of the transparent conductive film 10 from one touch point to the different electrodes varies significantly. Consequently, a diversity of the signal variation values are detected from the different electrodes varies significantly. Therefore, one or more touch points can be detected according to a size or sizes of the variation values detected from the electrodes of the touch panel. In addition, a detecting precision of the touch points can be improved by the variation values which varied significantly.

Depending on the embodiment, certain steps of methods described may be removed, others may be added, and the sequence of steps may be altered. It is also to be understood that the description and the claims drawn to a method may include some indication in reference to certain steps. However, the indication used is only to be viewed for identification purposes and not as a suggestion as to an order for the steps.

Finally, it is to be understood that the above-described embodiments are intended to illustrate rather than limit the present disclosure. Variations may be made to the embodiments without departing from the spirit of the present disclosure as claimed. Elements associated with any of the above embodiments are envisioned to be associated with any other embodiments. The above-described embodiments illustrate the scope of the present disclosure but do not restrict the scope of the present disclosure.

What is claimed is:

1. A transparent conductive film comprising a plurality of first transparent conductive stripes extending along a first direction and a plurality of second transparent conductive stripes extending along a second direction and intersecting the plurality of first transparent conductive stripes, wherein the plurality of first conductive stripes are spaced from each other and extend substantially along a first direction, and the plurality of second transparent conductive stripes are spaced from each other and extend substantially along a second direction, the plurality of first transparent conductive stripes are electrically connected with the plurality of second transparent conductive stripes, wherein the plurality of first transparent conductive stripes and the plurality of second conductive stripes are arranged in patterns such that the transparent conductive film has an anisotropic impedance, the first direction is a low impedance direction, and a resistivity of the transparent conductive film in the low impedance direction is smaller than the resistivity of the transparent conductive film in the second direction and any other direction.

2. The transparent conductive film of claim 1, wherein the second direction is a high impedance direction, the resistivity of the transparent conductive film along the high impedance direction is greater than the resistivity along any other direction, and a resistivity ratio of the transparent conductive film along the low impedance direction and the high impedance direction is in a range from about 1:30 to about 1:1000.

3. The transparent conductive film of claim 2, wherein a material of the plurality of first transparent conductive stripes is the same as a material of the plurality of second transparent conductive stripes, and a width ratio of one first transparent conductive stripe and one second transparent conductive stripe is in a range from about 100:1 to about 500:1.

4. The transparent conductive film of claim 2, wherein adjacent first transparent conductive stripes are electrically connected with each other via one or more of the plurality of second transparent conductive stripes.

5. The transparent conductive film of claim 4, wherein each of the plurality of second transparent conductive stripes is directly contacting each of the plurality of first transparent conductive stripes, and each of the plurality of first transparent conductive stripes is directly contacting each of the plurality of second transparent conductive stripes.

6. The transparent conductive film of claim 2, wherein the material of the plurality of first transparent conductive stripes and the plurality of second transparent conductive stripes are different.

7. The transparent conductive film of claim 6, wherein the material of the plurality of first transparent conductive stripes is a transparent and conductive material selected from the group consisting of metal oxide, metal nitride, and metal fluoride; the material of the plurality of second transparent conductive stripes is a transparent and conductive material selected from the group consisting of conductive polymer, carbon nanotubes, and graphene.

8. The transparent conductive film of claim 7, wherein the plurality of first transparent conductive stripes are made of indium tin oxides, and the plurality of second transparent conductive stripes are stripe-shaped carbon nanotube transparent conductive films.

9. The transparent conductive film of claim 2, wherein an angle between the low impedance direction and the high impedance direction is in a range from about 10degrees to about 90 degrees.

10. The transparent conductive film of claim 1, wherein a material of the plurality of first transparent conductive stripes and the plurality of second transparent conductive stripes is one material selected from the group consisting of metal oxide, metal nitride, metal fluoride, conductive polymer, graphene, and carbon nanotube transparent conductive film comprising a plurality of carbon nanotubes.

11. The transparent conductive film of claim 10, wherein the metal oxide comprises at least one of stannic oxide, zinc oxide, cadmium oxide, or indium oxide, indium tin oxide, indium zinc oxide, gallium zinc oxide, and aluminum zinc oxide, the metal nitride comprises titanium nitride; the conductive polymer comprises at least one of poly(3,4-ethylenedioxythiophen) and a composition of PEDOT and polystyrene sulfonate.

12. The transparent conductive film of claim 1, wherein at least one of the plurality of first transparent conductive stripes and the plurality of second transparent conductive stripes is selected from the group consisting of a straight stripe, a square wave stripe, a waved stripe, a zigzag stripe, a stepped shaped stripe, a cambered stripe, and combinations thereof.

13. The transparent conductive film of claim 12, wherein a width of one of the plurality of first transparent conductive stripes or the plurality of second transparent conductive stripes is varied along a length thereof.

14. The transparent conductive film of claim 1, further comprising a plurality of optical compensation films disposed between adjacent first transparent conductive stripes of the plurality of first transparent conductive stripes or adjacent second transparent conductive stripes of the plurality of second transparent conductive stripes, and the plurality of optical compensation films are spaced from each of the plurality of first transparent conductive stripes and each of the plurality of second transparent conductive stripes.

15. The transparent conductive film of claim 14, wherein each optical compensation film comprises a plurality of sub-optical-films spaced from each other.

16. A transparent conductive film comprising a plurality of one-dimensional transparent conductors stacked and intersecting each other, some of the plurality of one-dimensional transparent conductors extend along a first direction, and a resistivity of the transparent conductive film in the first direction is smaller than the resistivity in the any other direction of the transparent conductive film.

17. The transparent conductive film of claim 16, wherein the plurality of one-dimensional transparent conductors comprises a plurality of first transparent conductive stripes extending along the first direction, and a plurality of second transparent conductive stripes extending along the second direction; the plurality of first transparent conductive stripes are directly stacked and crossed with the plurality of second transparent conductive stripes.

18. A touch panel comprising a substrate, at least one transparent conductive film disposed on a surface of the substrate, and a plurality of electrodes spaced from each other and electrically connected with the at least one transparent conductive film; wherein the at least one transparent conductive film comprises a plurality of first transparent conductive stripes extending along a first direction and a plurality of second transparent conductive stripes extending along a second direction and intersecting the plurality of first transparent conductive stripes, wherein the plurality of first conductive stripes are spaced from each other and extend substantially along a first direction, and the plurality of second transparent conductive stripes are spaced from each other and extend substantially along a second direction, the plurality of first transparent conductive stripes are electrically connected with the plurality of second transparent conductive stripes, wherein the plurality of first transparent conductive stripes and the plurality of second conductive stripes are arranged in patterns such that the transparent conductive film has an anisotropic impedance, the first direction is a low impedance direction, and a resistivity of the transparent conductive film in the low impedance direction is smaller than the resistivity of the transparent conductive film in the second direction and any other direction.

* * * * *